United States Patent
Refai-Ahmed et al.

(10) Patent No.: US 10,147,664 B2
(45) Date of Patent: Dec. 4, 2018

(54) DYNAMIC MOUNTING THERMAL MANAGEMENT FOR DEVICES ON BOARD

(71) Applicant: Xilinx, Inc., San Jose, CA (US)

(72) Inventors: Gamal Refai-Ahmed, Santa Clara, CA (US); Suresh Ramalingam, Fremont, CA (US); Daniel Elftmann, San Jose, CA (US); Brian D. Philofsky, Longmont, CO (US); Anthony Torza, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/495,720

(22) Filed: Apr. 24, 2017

(65) Prior Publication Data

US 2018/0308783 A1    Oct. 25, 2018

(51) Int. Cl.

| H01L 23/10 | (2006.01) |
| H01L 23/34 | (2006.01) |
| H01L 23/367 | (2006.01) |
| H05K 1/18 | (2006.01) |
| H01L 23/433 | (2006.01) |
| H01L 23/373 | (2006.01) |
| H01L 23/498 | (2006.01) |
| H01L 23/00 | (2006.01) |

(52) U.S. Cl.
CPC ...... *H01L 23/3675* (2013.01); *H01L 23/3672* (2013.01); *H01L 23/3736* (2013.01); *H01L 23/433* (2013.01); *H01L 23/4338* (2013.01); *H01L 23/49816* (2013.01); *H01L 24/16* (2013.01); *H01L 24/32* (2013.01); *H01L 24/73* (2013.01); *H05K 1/181* (2013.01); *H01L 2224/16225* (2013.01); *H01L 2224/32221* (2013.01); *H01L 2224/73253* (2013.01); *H05K 2201/10378* (2013.01); *H05K 2201/10734* (2013.01)

(58) Field of Classification Search
CPC ................. H01L 23/34; H01L 21/4882; H01L 2224/29015; H01L 23/427
USPC .................................................. 257/706, 707
See application file for complete search history.

(56) References Cited

U.S. PATENT DOCUMENTS

| 5,323,294 A | 6/1994 | Layton et al. |
| 7,180,179 B2 * | 2/2007 | Mok ..................... H01L 23/427 257/675 |
| 7,186,590 B2 | 3/2007 | Alcoe et al. |
| 7,615,854 B2 * | 11/2009 | Montgomery .......... H01L 23/13 257/678 |

(Continued)

OTHER PUBLICATIONS

Specification and drawings for U.S. Appl. No. 15/369,607, filed Dec. 5, 2016, Refai-Ahmed et al.

*Primary Examiner* — S. V. Clark
(74) *Attorney, Agent, or Firm* — Keith Taboada

(57) ABSTRACT

Chip packages and electronic devices are provided that include a heat sink flexibly interfaced with a die for enhanced temperature control. In one example, a solid state electronic assembly is provided that includes a first integrated circuit (IC) die mounted to a substrate and a heat sink mounted over the first IC die. The heat sink includes a thermally conductive plate and a first thermal carrier. The first thermal carrier has a first end mechanically fixed to the conductive plate. The first thermal carrier has a second end cantilevered from the conductive plate. The second end is in conductive contact with a top surface of the first IC die.

24 Claims, 8 Drawing Sheets

(56) References Cited

U.S. PATENT DOCUMENTS

| | | | |
|---|---|---|---|
| 7,663,883 B2 * | 2/2010 | Shirakami | H01L 23/373 165/46 |
| 7,944,046 B2 | 5/2011 | Chao | |
| 9,490,188 B2 | 11/2016 | Arvelo et al. | |
| 2009/0108439 A1 * | 4/2009 | Brandenburg | H01L 23/473 257/714 |
| 2015/0279761 A1 * | 10/2015 | Bet-Shliemoun | H01L 23/42 257/714 |
| 2016/0005676 A1 * | 1/2016 | Orimoto | H01L 24/33 257/714 |
| 2016/0019937 A1 | 1/2016 | Arora et al. | |

* cited by examiner

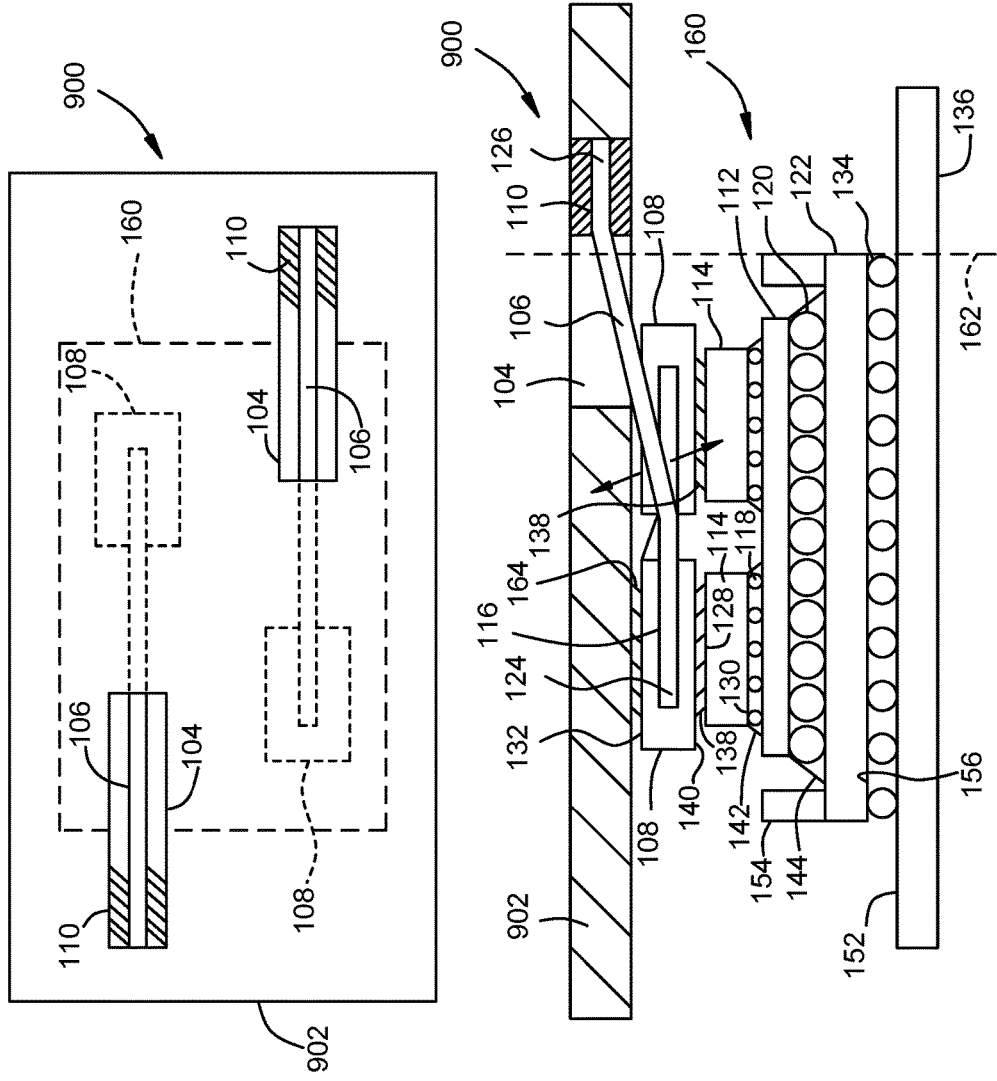

DYNAMIC MOUNTING THERMAL MANAGEMENT FOR DEVICES ON BOARD

TECHNICAL FIELD

Embodiments of the present disclosure generally relate to chip packages and electronic devices having the same, and in particular, to chip packages having a die interfaced with a thermal carrier for enhanced temperature control.

RELATED ART

Electronic devices, such as tablets, computers, server, in-door telecom, out-door telecom, industrial computers, high performance computing data centers, copiers, digital cameras, smart phones, control systems and automated teller machines, among others, often employ electronic components which leverage chip packages for increased functionality and higher component density. Conventional chip packaging schemes often utilize package substrates, often in conjunction with a through-silicon-via (TSV) interposer, to enable a plurality of integrated circuit (IC) dice to be mounted to a single substrate. The IC dice may include memory, logic, MEMS, RF or other IC device.

Although chip packaging has enabled increased device density and performance, the increased density and performance has also made managing the heat generated by the devices more challenging. In conventional chip packages, heat sinks are often employed to conductively remove heat generated from the dies of the chip packages. However, heat sinks utilized to provide improved heat transfer from the IC dice are generally limited by the amount of heat that can be transferred by direct thermal conduction. Moreover, lid-less chip packages often have varying die heights both within and between packages. Thus, the IC dice of the lid-less chip packages may not have good thermal contact with the heat sink, and thereby may not exhibit efficient heat transfer. Additionally, if a large thickness of thermal interface material is needed to bridge the distance the IC dice and the heat sink, heat transfer therebetween will be further degraded due to the undesirable excess thickness of the thermal interface material.

Therefore, a need exists for an improved configuration for enhancing the thermal management of chip packages.

SUMMARY

Chip packages and electronic devices are provided that include a heat sink flexibly interfaced with a die for enhanced temperature control. In one example, a solid state electronic assembly is provided that includes a first integrated circuit (IC) die mounted to a substrate and a heat sink mounted over the first IC die. The heat sink includes a thermally conductive plate and a first thermal carrier. The first thermal carrier has a first end mechanically fixed to the conductive plate. The first thermal carrier has a second end cantilevered from the conductive plate. The second end is in conductive contact with a top surface of the first IC die.

In another example, a solid state electronic assembly is provided that includes a housing having at least a first slot and a second slot, a first board assembly disposed in the first slot of the housing, and a second board assembly disposed in the second slot of the housing. The first board assembly has an integrated circuit (IC) die mounted thereto. The second board assembly includes a thermally conductive plate and a first thermal carrier. The first thermal carrier includes a first end and a second end. The first end mechanically is fixed to the conductive plate. The second end is cantilevered from the conductive plate and is in conductive contact with a top surface of the IC die mounted to the first board.

In yet another embodiment, a method for thermally managing heat generated from an integrated circuit (IC) die, the method includes transferring heat from a IC dice to a first end of a thermal carrier, transferring heat from a second end of the thermal carrier to a conductive plate, the first end of the thermal carrier cantilevered from the conductive plate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 9 is a cross sectional schematic view of an IC package including IC dice interfaced with a heat sink.

FIG. 10 is a top view of the heat sink and integrated IC package of FIG. 9.

To facilitate understanding, identical reference numerals have been used, where possible, to designate identical elements that are common to the figures. It is contemplated that elements of one embodiment may be beneficially incorporated in other embodiments.

DETAILED DESCRIPTION

Embodiments of the disclosure generally provide chip packages and electronic devices that include a heat sink that improves the thermal management of one or more IC dice of the chip packages. The examples disposed herein utilize a thermal carrier that is dynamically mounted to the heat sink that enables one end of the thermal carrier to move freely relative to the opposite end of the thermal carrier that is fixed to the heat sink. The free end of the thermal carrier substantially eliminate tolerance issues relating to the distances between the heat sink and the surface of each die, thereby reducing the thickness of thermal interface materials utilized across the interface. The reduced thickness of thermal interface materials provides better heat transfer and thermal management, and ultimately better die performance.

Moreover, the force exerted by the free end of the thermal carrier on the IC die is substantially independent of tolerance and dimension variations between the die and heat sink. Thus, the force against the die can be more precisely controlled, thereby reducing unwanted stresses on the IC package and printed circuit board, while increasing device reliability and performance.

Additionally, in some examples described herein provide two paths of thermal conduction between the die and heat sink. For example, the die may directly conduct heat through a pad to the heat sink in first heat transfer path, and die may also directly conduct heat through a thermal carrier to the heat sink in a second heat transfer path. Furthermore, as the thermal carrier transferred heat to the heat sink in a region of the heat sink spatially apart and distant from a region in which the pad transfers heat directly to the heat sink, the rate of heat transfer from the die to the heat sink is greatly increase as compared to through either of just one of the heat transfer paths.

In other examples, a third heat transfer path may be added to route heat from the IC die directly to the printed circuit board on which the IC package is mounted. This additional heat transfer path not only improves the overall heat efficiency of the electronic device, but beneficially reduces the reliance on the heat sink to manage the entire heat load which results in more robust heat transfer management and ultimately improved die performance.

Advantageously, the thermal management packaging solution described herein can be utilized on lid-less IC packages. Thus, the materials and assembly costs of the IC package are reduced while providing more robust thermal management of heat generated from dice of the IC package.

Figure 1:
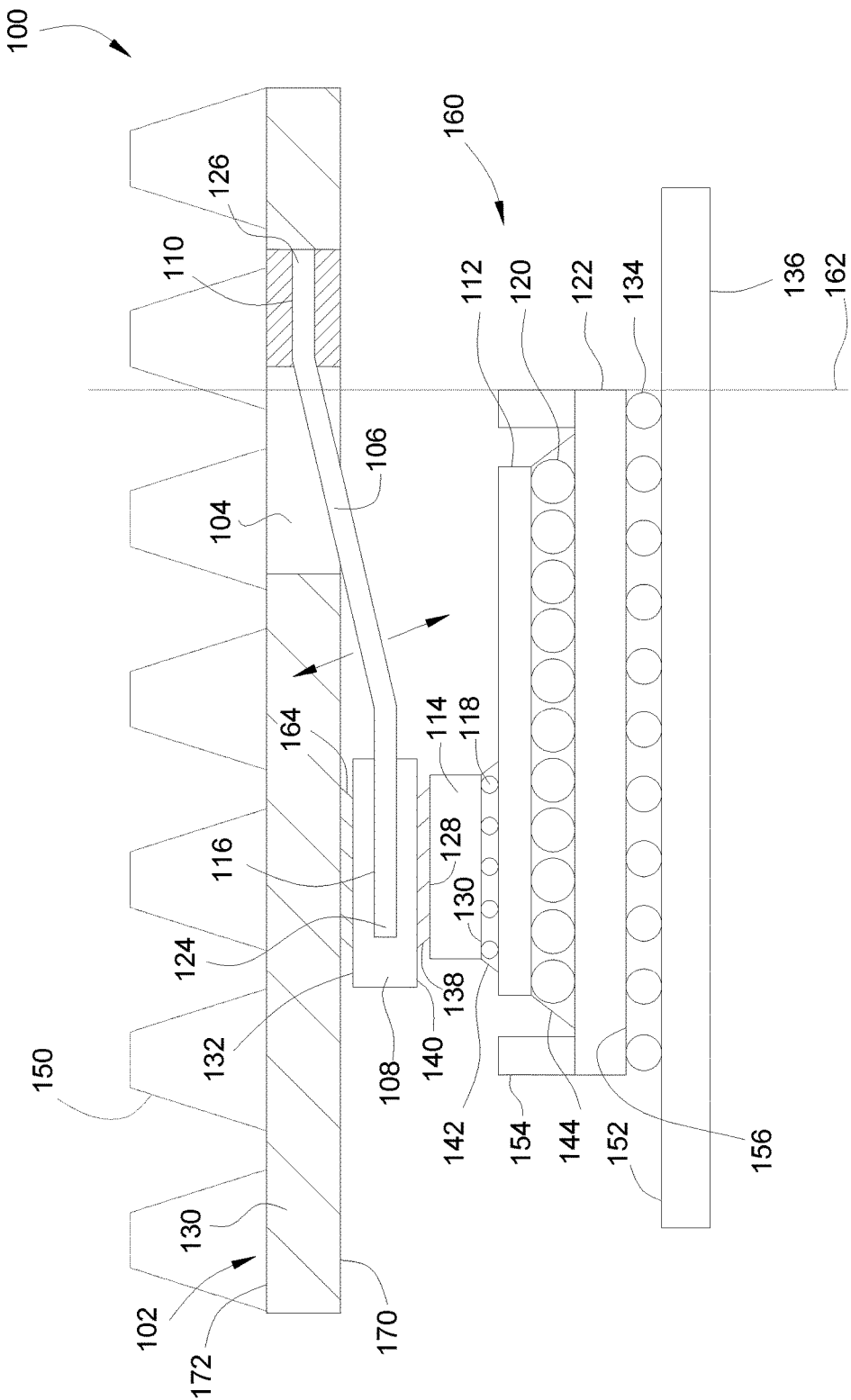
FIG. 1 is a cross sectional schematic view of one example of an integrated chip (IC) package including an IC die interfaced with a heat sink.

Turning now to FIG. 1, an exemplary electronic device 100 is illustrated embodied as a chip package 160 mounted on a printed circuit board (PCB) 136 and interfaced with a heat sink 102. The heat sink 102 includes a thermally conductive plate 130 that may have a planar area that is at least as large as or larger than a planar area of the chip package 160. Although only one chip package 160 is illustrated interface with the heat sink 102 in FIG. 1, one or more additional chip packages 160 may be interfaced with a single heat sink 102.

The thermally conductive plate 130 of the heat sink 102 is fabricated from a material having good thermal conductivity, such as metal, metal alloy, or carbon. Examples of suitable materials for fabricating the heat sink 102 include copper, nickel-plated copper or aluminum, among other suitable materials. The heat sink 102 has a top 172 that faces away from the chip package 160 and a bottom 170 that faces the chip package 160. The heat sink 102 may also include one or more heat transfer fins 150 (shown in phantom). The heat transfer fins 150 may extend from the top 172 of the heat sink 102 as show in FIG. 1, or alternatively (or in addition), the heat transfer fins 150 may extend from the bottom 170 of the heat sink 102 as show in FIG. 2.

Continuing to refer to FIG. 1, the chip package 160 includes at least one or more IC dice 114 connected optionally by a silicon-through-via (TSV) interposer 112 to a package substrate 122. Alternatively, the chip package 160 may have a monolithic construction, having one or more IC dice 114 connected directly to the package substrate 122, for example as flip chip ball grid array (FCBGA), ball grid array (BGA), wire bond and the like, In another alternative example, the chip package 160 may be configured to have two or more IC dice 114 in a vertically stacked configuration, also known as a 3D or stacked die package. It is contemplated that the chip package 160 may have other configurations. Although one IC die 114 is shown in FIG. 1, the number of IC dice may range from one to as many as can be fit within the chip package 160 in order to meet design criteria. As generally the die 114 of the chip package 160 is directly coupled to one of interposer 112 or package substrate 122, the interposer 112 or package substrate 122 are sometimes both referred to as "the substrate" to which the die 114 is mounted.

The interposer 112 includes circuitry for electrically connecting the IC die 114 to circuitry of the package substrate 122. The circuitry of the interposer 112 may optionally include transistors. Package bumps 120, also known as "C4 bumps," are utilized to provide an electrical connection between the circuitry of the interposer 112 and the circuitry of the package substrate 122. The package substrate 122 may be mounted and connected to the PCB 136, utilizing solder balls 134, wire bonding or other suitable technique. An undermolding 144 may be utilized to fill the space not taken by the package bumps 120 between the PCB 136 and the interposer 112, thereby providing structural rigidity to the chip package 160.

Figure 6:
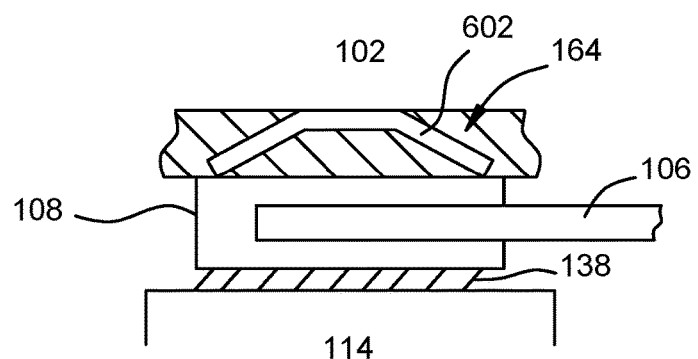
FIG. 6 is a partial cross sectional schematic view of a thermal interface between an IC die, a thermal carrier and a heat sink.

The IC die 114 is mounted to one or more surfaces of the interposer 112, or alternatively in embodiments wherein an interposer is not utilized, to the package substrate 122. The IC dice 114 may be programmable logic devices, such as field programmable gate arrays (FPGA), memory devices, optical devices, processors or other IC logic structures. Optical devices include photo-detectors, lasers, optical sources, and the like. In the embodiment depicted in FIG. 1, the IC die 114 is mounted to a top surface of the interposer 112 by a plurality of micro-bumps 118. The micro-bumps 118 electrically connect the circuitry of the IC die 114 to circuitry of the interposer 112. The circuitry of the interposer 112 connects the micro-bumps 118 to selective package bumps 120, and hence, connects selective circuitry of the IC die 114 to the package substrate 122, to enable communication of the IC die 114 with the PCB 136 after the chip package 160 is mounted within an electronic device (such as shown in FIG. 6). When the optional interposer 112 is not present, the micro-bumps 118 connects selective circuitry of the IC die 114 to the package substrate 122 to enable communication of the IC die 114 with the PCB 136. An undermolding 142 may be utilized to fill the space not taken by the micro-bumps 118 between the IC die 114 and interposer 112 to provide structural rigidity to the chip package 160.

The chip package 160 may optionally include a stiffener 154. The stiffener 154 is coupled to the package substrate 122 and circumscribes the IC dice 114. The stiffener 154 can extend to peripheral edges of the package substrate 122 to provide mechanical support which helps prevent the chip package 160 from bowing and warpage. The stiffener 154 may be a single layer structure or a multi-layer structure. The stiffener 154 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. The stiffener 154 can also be made of organic materials such as copper-clad laminate. As the stiffener 154 is mechanically decoupled (i.e., not directly mechanically connected) from the heat sink 102, tolerance stacks or parallelism mismatch between the stiffener 154 and the heat sink 102 will not induce stress on the IC package components or PCB, resulting in less warpage and delamination of the various layers and components of the chip package 160 compared to that which would be conventionally induced in IC packages having lids and stiffeners.

A thermally conductive pad 108 is disposed over the IC die 114. As the thermally conductive pad 108 is in thermal contact with the IC die 114, the thermally conductive pad 108 is configured to receive heat from the IC die 114. As such, the pad 108 may be fabricated from a thermally conductive material, such as copper, nickel-plated copper or aluminum, among other suitable material. The pad 108 may have a thickness of between about 0.5 mm and about 3.0 mm, although other thicknesses may be utilized.

The pad 108 has a top surface 132 and a bottom surface 140. The top surface 132 faces the heat sink 102, while the bottom surface 140 faces the IC die 114. To enhance heat transfer between the pad 108 and the heat sink 102, a conforming heat transfer material 164 is disposed between the top surface 132 and a bottom surface 170 of the heat sink 102. Similarly, to enhance heat transfer between the pad 108 and the IC die 114, a conforming heat transfer material 138 is disposed between the bottom surface 140 and a top surface 128 of the IC die 114. The conforming heat transfer materials 138, 164 may be a thermal interface material (TIM) or phase change material (PCM). The conforming heat transfer material 138, 164 may include metal, carbon or other highly thermally conductive particles, fillers or additives that enhance the heat transfer coefficient of the conforming heat transfer material 138, 164. The conforming heat transfer material 138, 164 is generally a heat transfer material having a conductivity of at least about 0.3 W/m·K. Examples of materials suitable for use the conforming heat transfer material 138, 164 includes thermal grease, thermally conductive epoxy, phase change materials, conductive tapes, and silicone-coated fabrics among other suitable materials. The conforming heat transfer materials 138, 164 may be a soft or compliant adhesive to allow compensation between mismatched heights of neighboring IC dice 114 within the chip package 160 or between IC dice 114 of neighboring chip packages 160 (such as later illustrated in FIGS. 8-10). In one example, the conforming heat transfer materials 138, 164 may be a thermal gel or thermal epoxy, such as for example, packaging component attach adhesives available from AI Technology, Inc., located in Princeton Junction, N.J. In another example, the conforming heat transfer materials 138, 164 may be a phase change material, such as Laird PCM 780. In yet another example, the conforming heat transfer materials 138, 164 may be a soft conductive filler material, such as T630 Thermal Gel or A- Gap 580, available from Chomerics, a division of Parker Hannifin Corp. Heat transfer from the die 114 through the pad 108 and conforming the heat transfer materials 138, 164 to the heat sink 102 can be considered a first heat transfer path for heat transfer, which augments (i.e., make more efficient) the other heat transfer paths of heat transfer further described below.

The pad 108 is additionally interfaced with a thermal carrier 106 that provides a second heat transfer path for heat transfer between the die 114 and the heat sink 102. As the interface between the thermal carrier 106 and the heat sink 102 is spatially distant from the region in which the pad 108 directly transfers heat to the heat sink 102 through the heat transfer materials 138, 164, the rate of heat transfer from the die 114 to the heat sink 102 is greatly increase as compared to through either of just one of the heat transfer paths. Moreover, the spatially separation between the interface between thermal carrier 106 and the heat sink 102 and the die 114 allows for improved thermal management within the package 160 by utilizing the thermal carrier 106 to route heat away from neighboring potentially heat sensitive areas to regions that can more readily accommodate a higher heat load. This advantageously allows denser packing of dice 114 having disparate heat tolerances.

In the example depicted in FIG. 1, the thermal carrier 106 has a first end 124 and a second end 126. The first end 124 of the thermal carrier 106 is mounted to the pad 108. For example, the first end 124 of the thermal carrier 106 is disposed in a hole 116 formed in the pad 108. The first end 124 of the thermal carrier 106 and the pad 108 may have a heat transfer enhancing connecting material therebetween, such as solder, brazing material, thermally conductive adhesive or other heat transfer enhancing material.

The second end 126 of the thermal carrier 106 is mounted to the heat sink 102. For example, the second end 126 of the thermal carrier 106 is disposed in a slot 104 formed in the heat sink 102. The second end 126 of the thermal carrier 106 and the heat sink 102 may also have a heat transfer enhancing connecting material 110 therebetween, such as solder, brazing material, thermally conductive adhesive or other heat transfer enhancing material. Since the second end 126 of the thermal carrier 106 is fixed to the heat sink 102 while the first end 124 of the thermal carrier 106 and the pad 108 are relatively free to move relative the heat sink 102, tolerance mismatch or height variations between the bottom 170 of the heat sink 102 and the top 128 of the die 114 is readily accommodated by the cantilevered flexibility of the thermal carrier 106, thereby reducing stresses induced into the chip package 160 and PCB 136, while providing excellent heat transfer from the die 114 to the heat sink 102.

Due to the efficient heat transfer by the thermal carrier 106, the second end 126 of the thermal carrier 106 may be coupled to the heat sink 102 relatively far from the location of the die 114. For example, the second end 126 of the thermal carrier 106 may be coupled by the heat transfer enhancing connecting material 110 to the heat sink 102 at a distance beyond the planar extents of the chip package 160, for example as shown by the dashed line 162 demarcating an edge of the chip package 160. Thus in this example, the heat generated by the die 114 is delivered to the heat sink 102 well beyond the bounds of the chip package 160, making the region of the heat sink 102 directly above the chip package 160 having a lighter thermal load and thereby more able to accommodate thermal regulation of the components of the chip package 160 directly below. Looking at this example differently, the offset connection between the thermal carrier 106 and heat sink 102 results in a larger area of the heat sink 102 being available for thermal management for a given chip package size, thereby allowing greater heat generation and chip densities to be realized without exceeding the thermal budget of the chip package 160 as a result of the ability to efficiently transfer heat to spatially distant regions of the heat sink 102 (relative to the location of the die 114) via the thermal carrier 106.

Describing now the functionality and construction of one embodiment of the thermal carrier 106 in greater detail, the thermal carrier 106 is configured as a heat pipe and has a heat transfer enhancing material sealed therein. The heat transfer enhancing material is selected to take advantage of the principles of both thermal conductivity and phase transition to efficiently manage the transfer of heat between the pad 108 and the heat sink 102. At the hot interface at the first end 124 of the thermal carrier 106, i.e., the pad 108 contacting the IC die 114 through the heat transfer material 138, the heat transfer enhancing material in a liquid phase and in contact with a thermally conductive solid surface turns into a vapor by absorbing heat from the pad 108 and die 114. The vapor then travels between the hot first end 124 of the thermal carrier 106 to the cold interface, i.e., the second end 126 of the thermal carrier 106 cantilevered from the heat sink 102, and condenses back into a liquid—releasing the latent heat. The liquid then returns to the hot interface through either capillary action and/or gravity, and the cycle repeats. Due to the very high heat transfer coefficients for boiling and condensation, the thermal carrier 106 highly effectively and efficiently conducts heat from the die 114 and pad 108 to the heat sink 102.

In another embodiment, the thermal carrier 106 may alternatively be configured as a vapor chamber. The vapor chamber is generally a metal container having a heat transfer enhancing material sealed therein. The heat transfer enhancing material may be a TIM or PCM as described above. The interior surfaces of the metal container may be textured to improve heat transfer between the heat transfer enhancing material and the metal container. The surface texture may include at least one of pores, grooves, holes, pillars and ridges or other surface texture. The surface texture may be a large surface area enlarging feature, such as fins. Other examples of surface textures are micro-grooves, such as for example as further described below with reference to FIG. 7. The heat transfer enhancing material 138 functions to move from one side of the vapor chamber to another side via capillary force. The movement of the heat transfer enhancing material 138 is a passive two phase flow which effectively draws heat away from the pad 108 (and the IC die 114) through the surfaces of the thermal carrier 106 contacting the pad 108, and delivers the heat to the heat sink 102 through the surfaces of the thermal carrier 106 contacting the heat sink 102.

In yet another embodiment, the thermal carrier 106 may include a liquid cooling plate which can have a flow of cooling medium, such as a liquid or gas, forced therethrough via pump or fan. In one example, the cooling medium flowing through the thermal carrier 106 may be a refrigerant moved a via compressor. In other examples, the cooling medium may be water, oil or air.

In yet another embodiment, the thermal carrier 106 may alternatively be configured as a beam comprised of or coated with a material having a high coefficient of heat transfer. Suitable materials having high coefficient of heat transfer include copper, aluminum, graphite, graphene, industrial diamond and other high heat transfer material. The beam may be a bar, rod, tube or other suitable shape.

Generally, the geometry, material, deflection of the thermal carrier 106 may be selected to control the force generated by the pad 108 against the die 114. For example, the resiliency and spring force coefficient of the cantilevered thermal carrier 106 may be controlled by one or more of material selection, tubular profile, sidewall configuration, shape of the pipe and the like. The force applied by the thermal carrier 106 to urge the pad 108 against the die 114 is generally selected to ensure good heat transfer and to accept wide range of manufacturing tolerances for low cost fabrication, without generating excessive force that would undesirably contribute to the application of excess stress upon the die 114, components of the package 160, or the PCB 136.

Figure 2:
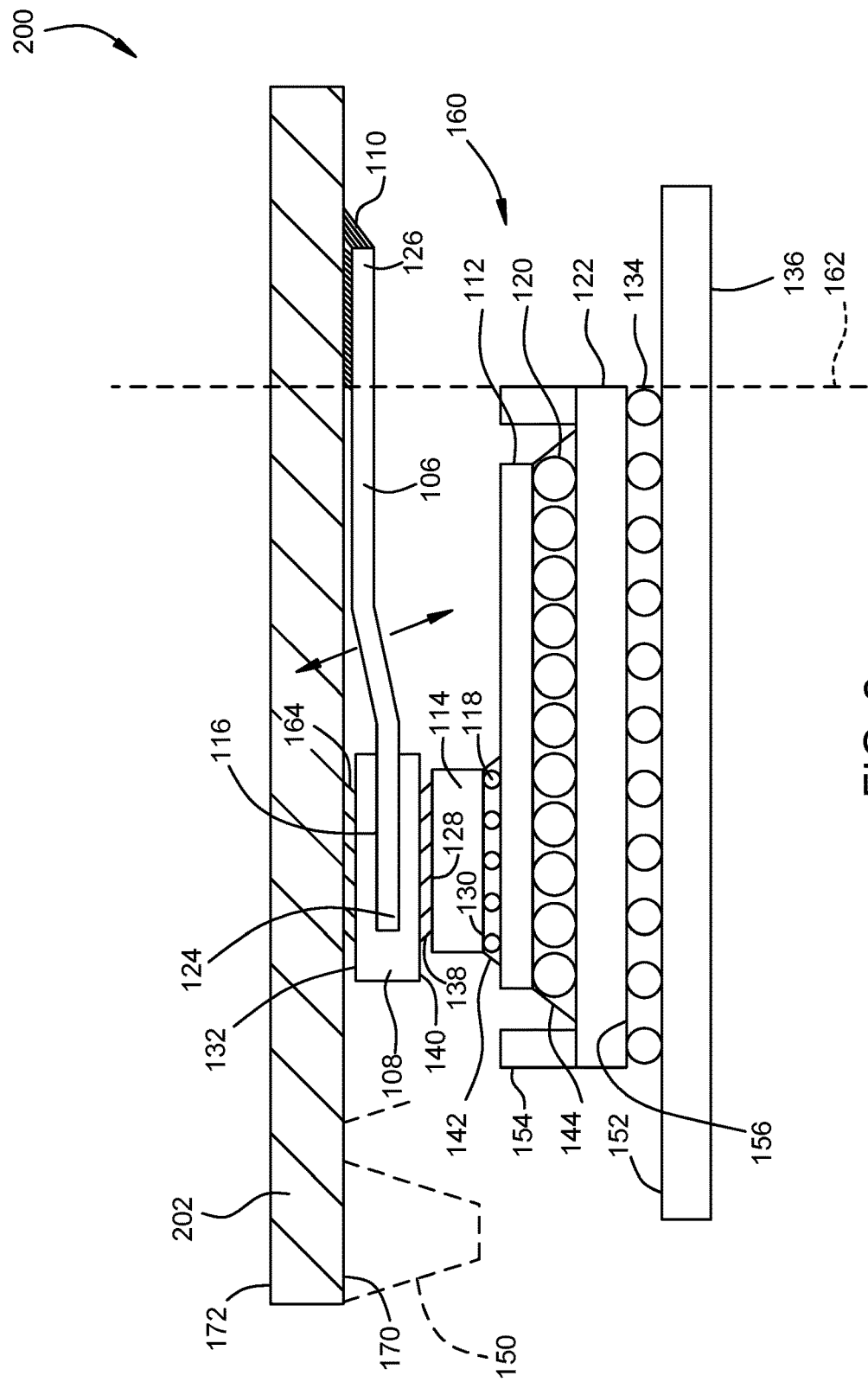
FIG. 2 is a cross sectional schematic view of another example of an IC package including an IC die interfaced with a heat sink.

FIG. 2 is a cross sectional schematic view of another exemplary electronic device 200 embodied as a chip package 160 mounted on a printed circuit board (PCB) 136 and interfaced with a heat sink 202. The chip package 160 is configured essentially the same as described above with reference to FIG. 1. The heat sink 202 may include fins 150 on a top 172 of the heat sink 202 as shown in FIG. 1, or on a bottom 170 of the heat sink 202 as shown in FIG. 2.

In the example depicted in FIG. 2, a first end 124 of a thermal carrier 106 is coupled to a pad 108 that is in contact with the die 114 as described with reference to FIG. 1 above. However, a second end 126 of the thermal carrier 106 is coupled by a heat transfer enhancing connecting material 110 to a bottom 170 of the heat sink 202. Thus, the thermal carrier 106, although still cantilevered from the heat sink 202, is disposed entirely between the heat sink 202 and chip package 160. As compared with the electronic device 100 described above, the heat sink 202 of the electronic device 200 is substantially solid, and thus, advantageously functions as a Faraday cage to beneficially isolate the chip package 160.

The electronic device 200 also includes two heat transfer paths as described above. Thus, over and above the benefit of providing a Faraday cage, the heat generated by the die 114 can be routed by the second heat transfer path well beyond the bounds of the chip package 160, making a larger area of the heat sink 202 available for thermal management for a give chip package size, thereby allowing greater heat generation and chip densities to be realized with increased thermal budgets.

Figure 4:
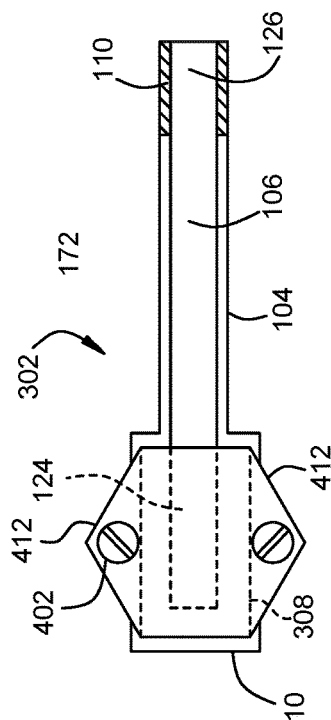
FIG. 4 is a partial top view of the heat sink and integrated IC package of FIG. 3.
Figure 3:
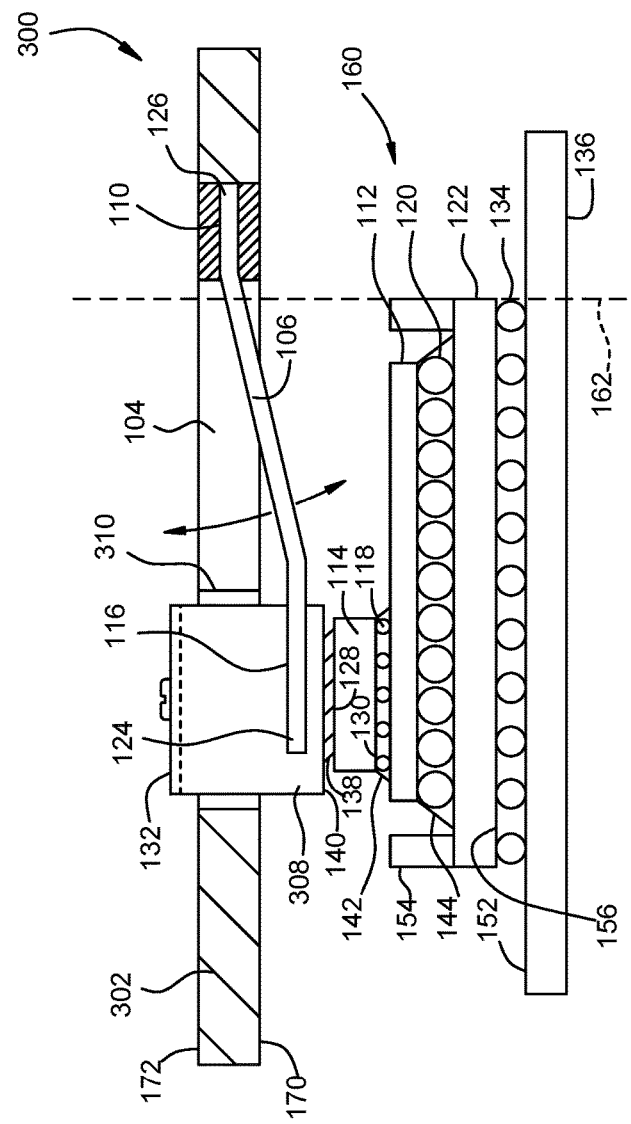
FIG. 3 is a cross sectional schematic view of another example of an IC package including an IC die interfaced with a heat sink.

FIG. 3 is a cross sectional schematic view of another exemplary electronic device 300 embodied as a chip package 160 mounted on a printed circuit board (PCB) 136 and having at least one die 114 interfaced with a heat sink 302. FIG. 4 is a partial top view of the heat sink 302 and integrated IC package 160 of FIG. 3. The chip package 160 is configured essentially the same as described above with reference to FIG. 1. The construction of the electronic device 300 is essentially the same as the electronic device 100 described above, except wherein the bias of a pad 308 against the die 114 is controlled by more than just the force generated by the geometry of a thermal carrier 106 coupling the pad 308 to the heat sink 302.

In the example depicted in FIGS. 3-4, a first end 124 (shown in phantom) of the thermal carrier 106 is coupled to the pad 308. A second end 126 of the thermal carrier 106 resides in a portion of a slot 104 formed in the heat sink 302. The second end 126 of the thermal carrier 106 is coupled by the heat transfer enhancing connecting material 110 to the heat sink 302. The end of the slot 104 opposite the heat transfer enhancing connecting material 110 opens to an aperture 310.

The aperture 310 is sized to allow the pad 308 to extend through the heat sink 302. Thus, a portion of the pad 308 is disposed below the bottom 170 of the heat sink 302 and in contact with the die 114, while another portion of the pad 308 is disposed above a top 172 of the heat sink 302.

The portion of the pad 308 disposed above the top 172 of the heat sink 302 includes tabs 412 that extend beyond the extents of the aperture 310. The tabs 412 include through holes that allow passage of fasteners 402 that engage with threaded holes (not shown) formed in the top 172 of the heat sink 302. The fasteners 402, such as machine screws and the like, can be tightened to urge the pad 308 through the aperture 310 and against the die 114, thereby providing control of the force of the pad 308 against the die 114 that is independent of the tolerance stack between the components of the device 300, and more finely tunable as compared to relying solely upon the force generated by the deflection of the thermal carrier 106 upon assembly of the device 300.

Self-evident from the description above, the thermal carrier 106 provides a first heat transfer path for the electronic device 300. Although not explicitly depicted in FIGS. 3-4, conforming heat transfer material may also be disposed in the aperture 310 between the pad 308 and the heat sink 302 to provide a second heat transfer path, thereby enhancing the thermal management of the chip package 160 beyond what is provided through the first heat transfer path.

Figure 5:
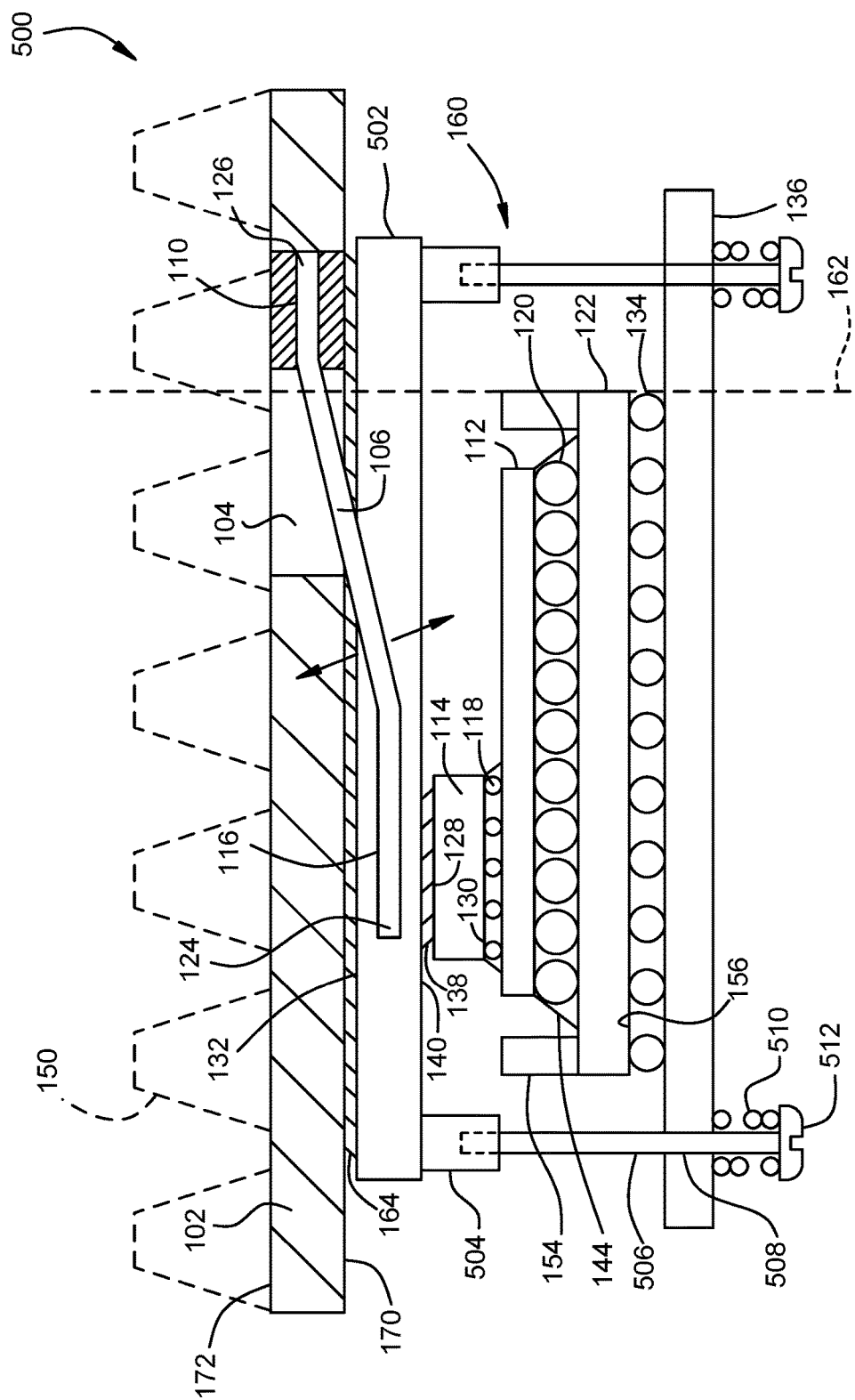
FIG. 5 is a cross sectional schematic view of another example of an IC package including an IC die interfaced with a heat sink through a biased pad.

FIG. 5 is a cross sectional schematic view of another exemplary electronic device 500 embodied as a chip package 160 mounted on a printed circuit board (PCB) 136 and having at least one die 114 interfaced with a heat sink 102 through a biased pad 502. The chip package 160, the PCB 136 and the heat sink 102 are substantially identical to as described with reference to the electronic device 100 of FIG. 1. However, it is contemplated that the biased pad 502 may be utilized with the other heat sinks described herein, or other suitably adapted heat sink.

In the example of FIG. 5, the bias of the pad 502 against the die 114 is controlled by more than just the force generated by the geometry of a thermal carrier 106 coupling the pad 502 to the heat sink 102. More specifically, the pad 502 includes a top surface 132 that faces the heat sink 102 and a bottom surface 140 that faces the chip package 160 and PCB 136. A plurality of threaded bosses 504 extend from the bottom surface 140 of the pad 502. Fasteners 506, extending through holes 508 formed in the PCB 136, threadingly engage with the threaded holes formed in the bosses 504. In one example, the fasteners 506 may be tightened to urge the bottom surface 140 of the pad 502 against the die 114 to ensure good physical contact and robust heat transfer therebetween. Alternatively, and as shown in the example of FIG. 5, a resilient force generating member 510 may be disposed between a head 512 of the fasteners 506 and the PCB 136 to more accurately control the force generated by the pad 502 against the die 114 to ensure that excess force and unwanted stresses are not applied to the chip package 160 and PCB 136, while maintaining good physical contact and robust heat transfer therebetween between the pad 502 and die 114. The resilient force generating member 510 may be one or more of a conical spring washer, a flat spring, a coil spring, elastomeric bushing or other resilient force generating structure.

In the example depicted in FIG. 5, the pad 502 is thermally conductive and configured to receive heat from the IC die 114. As with the pad 108 described above, the pad 502 may be fabricated from a thermally conductive material, such as copper, nickel-plated copper or aluminum, among other suitable materials. To enhance heat transfer between the pad 502 and the heat sink 102, a conforming heat transfer material 164 is disposed between the top surface 132 and a bottom surface 170 of the heat sink 102. Similarly, to enhance heat transfer between the pad 502 and the IC die 114, a conforming heat transfer material 138 is disposed between the bottom surface 140 and a top surface 128 of the IC die 114. The heat transfer between the heat sink 102 and the IC die 114 through the pad 502 and heat transfer materials 138, 164 defines the first heat transfer path as described above.

The pad 502 is additionally interfaced with a thermal carrier 106 that provides a second heat transfer path for heat transfer between the die 114 and the heat sink 102. As the interface between the thermal carrier 106 and the heat sink 102 is spatially distance from the region in which the pad 502 transfers heat to the heat sink 102 through the heat transfer materials 138, 164, the rate of heat transfer from the die 114 to the heat sink 102 is greatly increase as compared to through either of just one of the heat transfer paths. Moreover, the spatially separation between the interface between thermal carrier 106 and the heat sink 102 and the die 114 allows for improved thermal management within the package 160 by utilizing the thermal carrier 106 to route heat away from neighboring potentially heat sensitive areas to regions that can more readily accommodate a higher heat load. This advantageously allows denser packing of dice 114 having disparate heat tolerances.

The connection of the thermal carrier 106 and heat sink 102 is as described above with reference to FIG. 1. However, it is contemplated that alternative configurations may be utilized such as, but not limited to, as shown and described with reference to FIGS. 2-4.

In the example depicted in FIG. 5, the thermal carrier 106 has a first end 124 and a second end 126. The first end 124 of the thermal carrier 106 is mounted to the pad 502. For example, the first end 124 of the thermal carrier 106 is disposed in a hole 116 formed in the pad 502. The first end 124 of the thermal carrier 106 and the pad 502 may have a heat transfer enhancing connecting material therebetween, such as solder, brazing material, thermally conductive adhesive or other heat transfer enhancing material.

The second end 126 of the thermal carrier 106 is mounted to the heat sink 102. For example, the second end 126 of the thermal carrier 106 is disposed in a slot 104 formed in the heat sink 102. The second end 126 of the thermal carrier 106 and the heat sink 102 may also have a heat transfer enhancing connecting material 110 therebetween, such as solder, brazing material, thermally conductive adhesive or other heat transfer enhancing material. Since the second end 126 of the thermal carrier 106 is fixed to the heat sink 102 while the first end 124 of the thermal carrier 106 and the pad 502 are relatively free to move relative the heat sink 102, tolerance mismatch or height variations between the bottom 170 of the heat sink 102 and the top 128 of the die 114 is readily accommodated by the cantilevered flexibility of the thermal carrier 106, thereby reducing stresses induced into the chip package 160 and PCB 136, while enhancing thermal management of the dice 114 within the package 160.

Due to the efficient heat transfer by the thermal carrier 106, the second end 126 of the thermal carrier 106 may be coupled to the heat sink 102 relatively far from the location of the die 114. As described above, the use of the cantilevered thermal carrier 106 allows heat generated by the die 114 to be delivered to the heat sink 102 well beyond the bounds of the chip package 160, making the region of the heat sink 102 directly above the chip package 160 having a lighter thermal load and thereby more able to accommodate thermal regulation of the components of the chip package 160 directly below. This configuration results in large heat sink area relative to the chip package size, thereby allowing greater heat generation and chip densities to be realized without excessing a thermal budget of the chip package 160 due to the ability to efficiently transfer heat to spatially distant regions of the heat sink 102 via the thermal carrier 106.

In embodiments wherein the fasteners 506 are thermally conductive, for example fabricated from stainless steel or plain steel, the heat from the die 114 is also routed through a third heat transfer path from the pad 502 to the PCB 136 through the bosses 504 and fasteners 506. The third heat transfer path augments and enhances the heat removed from the die 114 through first and second heat transfer paths, thereby providing more robust thermal management of the chip package 160. Moreover, since the third heat transfer path routes heat to the PCB 136 rather than the heat sink 102, the ability of the heat sink 102 to absorb heat is not diminished by addition of another source of heat being routed to the heat sink 102.

FIG. 6 is a partial cross sectional schematic view of a thermal interface between an IC die 114, a thermal carrier 106 and a heat sink 102. The thermal interface illustrated in FIG. 6 mainly serves to route heat between the IC die 114 and the heat sink 102 through the conforming heat transfer materials 138, 164 (i.e., along the first heat transfer path) and to route heat between the IC die 114 and the heat sink 102 through the thermal carrier 106 (i.e., along the second heat transfer path).

In the embodiment depicted in FIG. 6, an elastic object 602 which can be utilized between the pad 108 and the heat sink 102. The elastic object 602 urges the pad 108 into good and robust physical contact with the die 114, thereby enhancing heat transfer between the die 114 and pad 108.

In one embodiment, the elastic object 602 may be a spring form is utilized between the pad 108 and the heat sink 102. The spring form may be a conical spring washer, a flat spring, a coil spring or other spring form. The spring form urges the pad 108 into good and robust physical contact with the die 114, thereby enhancing heat transfer between the die 114 and pad 108.

The elastic object 602 may optionally include one or more apertures. The apertures provide space through which a thermal interface material (TIM) or phase change material (PCM), disposed between the heat sink 102 and the pad 108, may pass as the elastic object 602 is compressed between the heat sink 102 and the pad 108. As the TIM or PCM (i.e., heat transfer enhancing material) squeezes between the heat sink 102 and the pad 108, the heat transfer enhancing material not only coats the facing surfaces of the heat sink 102 and the pad 108, but also encapsulates the elastic object 602. The encapsulated elastic object 602 has good heat transfer with the heat transfer enhancing material. Thus, the heat transfer between the heat sink 102 and the pad 108 (and ultimately the die 114) is enhanced by providing a combination of conductive paths between the heat sink 102 and the pad 108 that includes a path directly through the elastic object 602, a path directly through the heat transfer enhancing material, and a path routed though both the elastic object 602 and the heat transfer enhancing material. Accordingly, the heat transfer across the first heat transfer path as illustrated in FIG. 6 has improved heat transfer characteristics as compared to conventional thermal interfaces, and thus, allows greater performance and reliability of the chip package 160 being serviced by the thermal interface.

Figure 7:
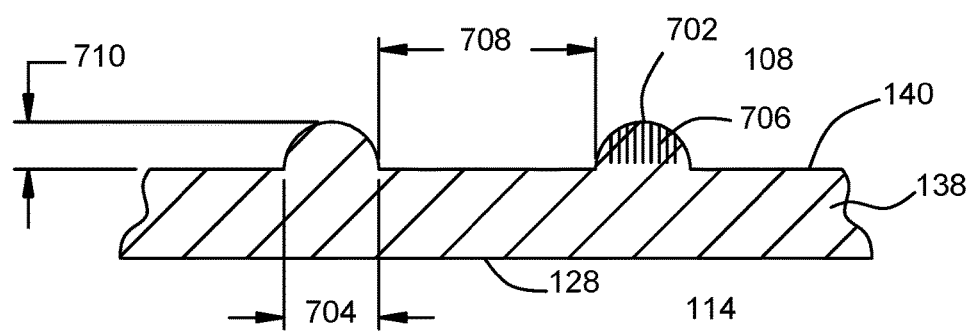
FIG. 7 is a partial cross sectional schematic view of a thermal interface between facing surfaces, heat transfer therebetween enhanced by micro-grooving.

FIG. 7 is a partial cross sectional schematic view of another thermal interface between facing surfaces having a thermal interface material (TIM) or phase change material (PCM) filling the gap therebetween. The facing surfaces are illustratively shown in FIG. 7 as a bottom surface 140 of a pad 108 and a top of a die 114, the facing surfaces may be any facing surfaces having the TIM or PCM (i.e., heat transfer enhancing material) disposed therebetween.

The heat transfer across the interface is enhanced by micro-grooves 702 formed in at least one of the facing surfaces comprising the interface. In the example provided in FIG. 7, the micro-grooves 702 are formed in the bottom surface 140 of the pad 108 while the top 128 of the die 114 is smooth. The micro-grooves 702 generally have a width 704 that is very small such that the total area of the micro-grooves 702 (i.e., the total length of the micro-grooves 702 multiplied the width 704) is much less, such as at least 90% less, than an area 708 of the bottom surface 140 of the pad 108 that has no micro-grooves.

The micro-grooves 702 may be formed in the pad 108 via etching or any other suitable method. For some examples, the micro-grooves 702 may be arranged in rows, in columns, as positive-sloping diagonals, as negative-sloping diagonals, or as a combination thereof, with respect to one orientation of the pad 108. For some examples, the micro-grooves 702 may have a depth on the order of 0.1 mm, and intersections of more than two grooves may have a depth on the order of 0.2 mm.

The heat transfer across the interface is enhanced by the micro-grooves 702 not only by increasing the total surface area of thermal interface available for heat transfer, but by also trapping bubbles or voids in the conforming heat transfer material 138 to the micro-grooves 702, leaving the conforming heat transfer material 138 essentially bubble and void-free across the area 708. As the majority of heat transfer occurs across the area 708, the lack of insulating bubbles and voids in the conforming heat transfer material 138 in this area not only improves heat transfer efficiency, but also promotes uniformity of heat transfer across the pad 108 due to the confinement of the bubbles and void preferentially to the micro-grooves 702.

Optionally, the micro-grooves 702 may additionally include a plurality of projecting structures 706. The projecting structures 706 generally extend into the volume of the micro-grooves 702. The projecting structures 706 may be confined to the volume of the micro-grooves 702, for example, but not extending beyond the bottom surface 140 of the pad 108 to avoid breakage. The projecting structures 706 may be formed of the same material as the pad 108. The projecting structures 706 may alternatively be deposited or grown within the volume of the micro-grooves 702 from other materials, such as carbon nano-tubes. The projecting structures 706 may be spaced far enough apart to allow the thermally conductive particles disposed in the heat transfer enhancing material to move therebetween. The projecting structures 706 function to break up the larger bubbles entrained in the conforming heat transfer material 138 into smaller bubbles. The smaller bubbles may become absorbed into the conforming heat transfer material 138, thereby eliminating the insulting effect of the bubbles. However, even those bubbles broken down by the projecting structures 706 that have not been absorbed into the conforming heat transfer material 138 are much smaller than the original bubbles, and therefore are less insulative and promote increased heat transfer efficiency across the interface between the surfaces. Thus, the projecting structures 706 additionally enhance the heat transfer across the interface.

For additionally clarity, it is specifically contemplated that substantially any thermal interface having a conforming heat transfer material filling the gap between facing surfaces may be adapted to improve the heat transfer between any of the facing surfaces bridged by a conforming heat transfer material utilizing either or both of the structures and techniques illustrated and described with reference to FIGS. 6-7.

Figure 8:
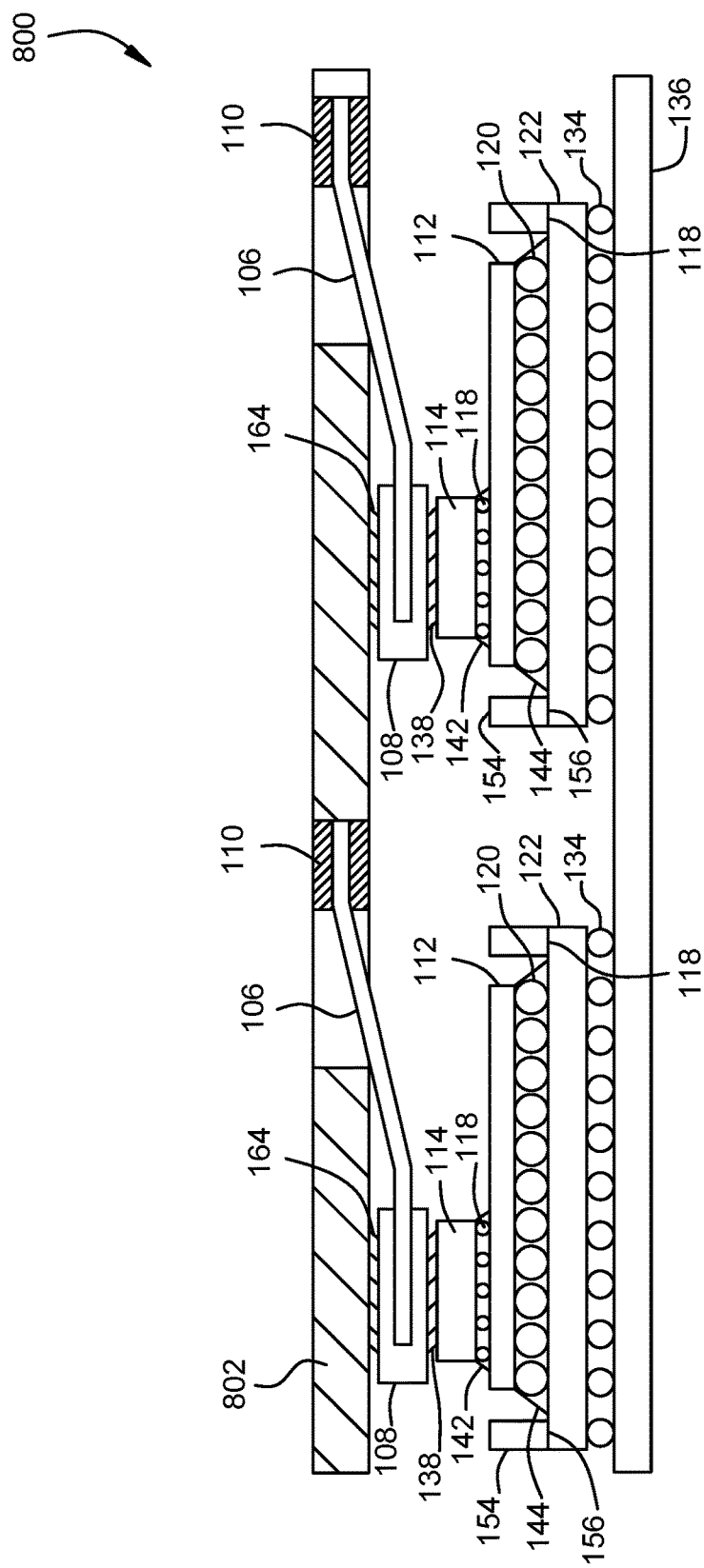
FIG. 8 is a cross sectional schematic view of multiple IC packages including IC dice interfaced with a common heat sink.

FIG. 8 is a cross sectional schematic view of an electronic device 800 having multiple IC packages 160 interfaced with a common heat sink 802. The IC packages 160 are mounted to a PCB 136 as described above with reference to FIG. 1. Additionally, each IC package 160 includes at least one IC die 114. At least one of the at least one IC die 114 is coupled by a thermal carrier 106 to the heat sink 802, for example, in a cantilevered manner. The cantilevered coupling of each chip package 160 by separate thermal carriers 106 to the common heat sink 802 allows the free end of each thermal carrier 106 to separately and independently move relative to the other thermal carriers 106, thereby compensating for height variations and tolerance stacks between the heights of each chip package 160 and the heat sink 802 so that undue stress is not applied to the die 114, package 160 or PCB 136, while maintaining good and close contact between the die 114 and pad 108 that enables robust heat transfer between the dice 114 and heat sink 802. Although the example depicted in FIG. 8 illustrates coupling between package 160 and heat sink 802 in the manner as depicted and described with reference to FIG. 1, it is contemplated the coupling between package 160, PCB 136 and heat sink 802 may alternatively be made in any of the manners as depicted and described with reference to FIGS. 1-7, or other suitable manner.

FIG. 9 is a cross sectional schematic view of an electronic device 900 having multiple dice 114 of an IC package 160 interfaced with a common heat sink 902. FIG. 10 is a top view of the electronic device 900 of FIG. 9. Referring to both FIGS. 9-10, the IC package 160 is mounted to a PCB 136 as described above with reference to FIG. 1. Additionally, the IC package 160 includes at least two IC dice 114 that are coupled by separate thermal carriers 106 to the heat sink 902, for example, in a cantilevered manner. The cantilevered coupling of each die 114 by separate thermal carriers 106 to the common heat sink 902 allows the free end of each thermal carrier 106 to separately and independently move relative to the other thermal carriers 106, thereby compensating for height variations and tolerance stacks between the heights of each die 114 and the heat sink 902 so that undue stress is not applied to the die 114, package 160 or PCB 136, while maintaining good and close contact between the dice 114 and pad 108 that enables robust heat transfer between the dice 114 and heat sink 902. Although the example depicted in FIG. 9 illustrates coupling between package 160 and heat sink 902 in the manner as depicted and described with reference to FIG. 1, it is contemplated the coupling between package 160, PCB 136 and heat sink 902 may alternatively be made in any of the manners as depicted and described with reference to FIGS. 1-7, or other suitable manner.

Figure 11:
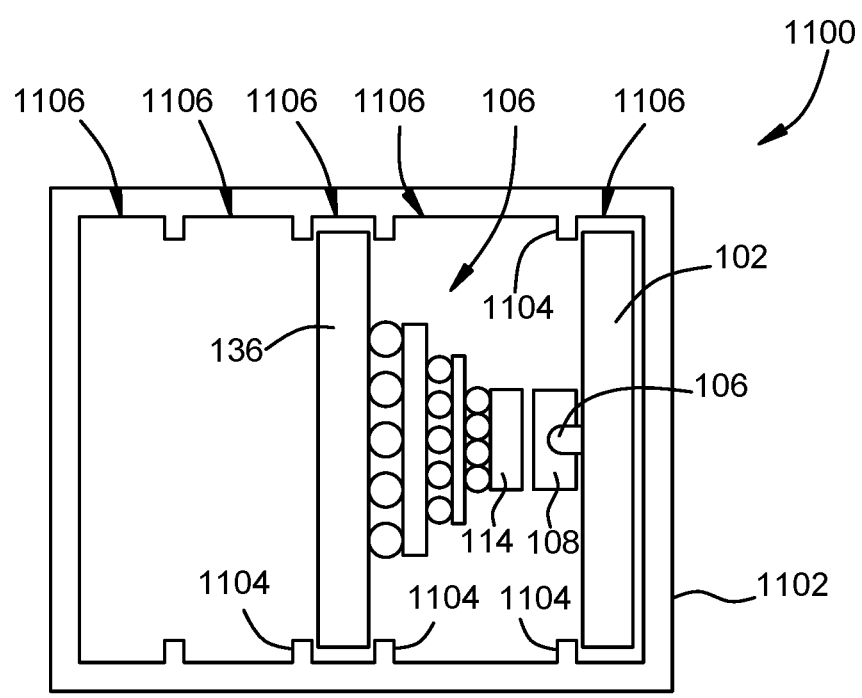
FIG. 11 is a side view of an electronic cassette having a printed circuit board and heat sink disposed in adjacent slots.

FIG. 11 is a side view of an electronic cassette 1100 having a printed circuit board 136 interfaced with a heat sink 102 disposed in neighboring slots 1106. The electronic cassette 1100 has a housing 1102 comprised of lateral sidewalls, a top, a bottom, a front and a back. The housing 1102 also includes a plurality of tabs 1104 extending from the top and the bottom partially into the housing 1102. The plurality of slots 1106 are defined between the tabs 1104, and between the outer most tabs 1104 and the lateral sidewalls of the housing 1102. The slots 1106 are open at least to the front of the cassette 1100, thus allowing PCB 136 including one or more chip packages 160 mounted thereon to be removably stored in the slots 1106 of the housing 1102. At least one slot 1106 neighboring the slot 1106 containing the PCB 136 has the heat sink 102 disposed therein. Depending on the height of the chip packages 160 formed in the PCB 136, the slot 1106 housing the heat sink 102 may be disposed in the immediately adjacent slot 1106, or other nearby slot 1106 better suited to accommodate the space needed between the PCB 136 and heat sink 102 due to the height of chip package 160.

The cassette 1100 is generally configured to channel heat away from the slots 1106 containing the heat sink 102. Thus, the cassette 1100 substantially increases the amount of heat that may be transferred from the chip package 160 into the heat sink 102, thereby allowing greater package densities, improved thermal management, and more robust performance. Although the example depicted in FIG. 11 illustrates coupling between package 160 and heat sink 102 in the manner as depicted and described with reference to FIG. 1, it is contemplated the coupling between package 160, PCB 136 and heat sink 102 may alternatively be made in any of the manners as depicted and described with reference to FIGS. 1-10, or other suitable manner.

Thus, chip packages and electronic devices have been described above that include a cantilevered thermal carrier. The cantilevered thermal carrier enables the free end of the thermal carrier to move relative to the heat sink, thus, substantially eliminating tolerance issues of the distance between the heat sink and die surface. The dynamically mounted thermal carrier also reduces the thickness of thermal interface materials needed across heat transfer interfaces as thick layers of thermal interface materials no longer are required to compensate for tolerance stacking issues. The reduced thickness of thermal interface materials provides better heat transfer and thermal management, and ultimately better die performance.

In another advantage, the force exerted by the free end of the thermal carrier on the IC die is substantially independent of tolerance and dimension variations between the die and heat sink. Thus, the pressure against the die and PCB can be more precisely controlled, thereby reducing unwanted stresses on the IC package and PCB, while increasing device reliability and performance. Additionally, in some examples described herein provide two and even three paths of thermal conduction between the die and heat sink, which further improves the rate at which heat can be removed from a die. Furthermore, as the thermal carrier transferred heat to the heat sink in a region of the heat sink spatially apart from a region in which the pad transfers heat to the heat sink, the rate of heat transfer from the die to the heat sink is greatly increased as compared to through either of just one of the heat transfer paths. Moreover, as the thermal management packaging solution described herein can be utilized on lid-less IC packages, material and assembly costs of the IC package are reduced while providing more robust thermal management of heat generated from dice of the IC package.

In a first example, the technology described herein may be embodied as a solid state electronic assembly that includes housing having at least a first slot and a second slot. A first board assembly is disposed in the first slot of the housing. The first board assembly has an integrated circuit (IC) die mounted to the first board assembly. A second board assembly is disposed in the second slot of the housing. The second board assembly includes thermally conductive plate and a first thermal carrier. The first thermal carrier has a first end and a second end. The first end is mechanically fixed to the conductive plate. The second end is cantilevered from the conductive plate. The second end is in conductive contact with a top surface of the IC die mounted to the first board.

In a second example, the thermally conductive plate described in the first example forms part of a Faraday cage.

In a third example, a method for thermally managing heat generated from an integrated circuit (IC) die is provided. The method includes (A) transferring heat from a IC dice to a first end of a thermal carrier; and (B) transferring heat from a second end of the thermal carrier to a conductive plate, the first end of the thermal carrier cantilevered from the conductive plate.

While the foregoing is directed to embodiments of the present disclosure, other and further embodiments may be devised without departing from the basic scope thereof, and the scope thereof is determined by the claims that follow.

What is claimed is:

1. A solid state electronic assembly comprising:
a substrate;
a first integrated circuit (IC) die mounted to the substrate; and
a heat sink mounted over the first IC die, the heat sink comprising:
a thermally conductive plate;
a thermally conductive pad disposed between the thermally conductive plate and the first IC die; and
a first thermal carrier having a first end and a second end, the first end mechanically fixed to the conductive plate, the second end cantilevered from the conductive pad, the second end in conductive contact with a top surface of the first IC die through the conductive pad, wherein a first heat transfer path is defined from the top surface of the first IC die, through the conductive pad to the first end of the first thermal carrier, and to the conductive plate, and wherein the second end of the first thermal carrier is free to move relative to the conductive plate.

2. A solid state electronic assembly comprising:
a substrate;
a first integrated circuit (IC) die mounted to the substrate; and
a heat sink mounted over the first IC die, the heat sink comprising:
a thermally conductive plate;
a thermally conductive pad disposed between the thermally conductive plate and the first IC die;
a first thermal carrier having a first end and a second end, the first end mechanically fixed to the conductive plate, the second end cantilevered from the conductive pad, the second end in conductive contact with a top surface of the first IC die through the conductive pad, wherein a first heat transfer path is defined from the top surface of the first IC die, through the conductive pad to the first end of the first thermal carrier, and to the conductive plate; and
a slot having the first end of the first thermal carrier received therein.

3. The electronic assembly of claim 1, wherein the first end of the first thermal carrier is brazed or soldered to the conductive plate.

4. The electronic assembly of claim 1, wherein the first end of the first thermal carrier is coupled to the conductive plate in a cantilevered orientation.

5. The electronic assembly of claim 1 further comprising:
thermal interface material disposed between the second end of the first thermal carrier and the conductive plate.

6. The electronic assembly of claim 1 further comprising:
thermal interface material disposed between the second end of the first thermal carrier and the first IC die.

7. The electronic assembly of claim 1 further comprising:
a conductive elastic object disposed between the second end of the first thermal carrier and the conductive plate.

8. The electronic assembly of claim 1 further comprising:
a pad coupled to the second end of the first thermal carrier, the pad thermally contacting the first IC die.

9. The electronic assembly of claim 8, wherein the slot formed in the conductive plate opens to an aperture configured to receive the pad.

10. The electronic assembly of claim 9, wherein the pad is biased towards the first IC die.

11. The electronic assembly of claim 10 further comprising:
at least one fastener engaging the pad and biasing the pad against the first IC die.

12. The electronic assembly of claim 9, wherein the conductive plate further comprises:
heat transfer fins extending from the conductive plate towards the first IC die.

13. The electronic assembly of claim 9, wherein the conductive plate further comprises:
heat transfer fins extending from the conductive plate away from the first IC die.

14. The electronic assembly of claim 1 further comprising:
a second IC die coupled to the substrate, the first and second IC dice covered by the heat sink; and
a second thermal carrier having a first end and a second end, the first end of the second thermal carrier mechanically fixed to the conductive plate; the second end of the second thermal carrier cantilevered from the conductive plate, the second end of the second thermal carrier in conductive contact with a top surface of the second IC die.

15. A solid state electronic assembly comprising:
a substrate;
a first integrated circuit (IC) die mounted to the substrate; and
a heat sink mounted over the first IC die, the heat sink comprising:
a thermally conductive plate;
a thermally conductive pad disposed between the thermally conductive plate and the first IC die; and
a first thermal carrier having a first end and a second end, the first end mechanically fixed to the conductive plate, the second end cantilevered from the conductive pad, the second end in conductive contact with a top surface of the first IC die through the conductive pad, wherein a first heat transfer path is defined from the top surface of the first IC die, through the conductive pad to the first end of the first thermal carrier, and to the conductive plate;
a second IC die coupled to the substrate, the first and second IC dice covered by the heat sink; and
a second thermal carrier having a first end and a second end, the first end of the second thermal carrier mechanically fixed to the conductive plate; the second end of the second thermal carrier cantilevered from the conductive plate, the second end of the second thermal carrier in conductive contact with a top surface of the second IC die, wherein the first and second IC dice and substrate belong to a first IC package, and wherein the electronic assembly further comprises:
a second IC package having at least one or more IC dice, the first and second IC packages covered by the heat sink; and
at least a third thermal carrier having a first end and a second end, the first end of the third thermal carrier mechanically fixed to the conductive plate; the second end of the third thermal carrier cantilevered from the conductive plate, the second end of the third thermal carrier in conductive contact with a top surface of the one or more IC dice comprising the second IC package, wherein the conductive plate covers the first and second IC packages.

16. The electronic assembly of claim 1 further comprising:
thermal interface material disposed between the conductive pad and the conductive plate.

17. The electronic assembly of claim 1 further comprising:
a thermally conductive elastic object disposed between the conductive pad and the conductive plate.

18. The electronic assembly of claim 1, wherein the thermally conductive pad is fastened to the substrate.

19. The electronic assembly of claim 1 further comprising:
thermal interface material disposed between the first thermal carrier and at least one of the conductive plate and the first IC die, the thermal interface material including highly thermally conductive particles.

20. The electronic assembly of claim 1, wherein the pad further comprises:
a hole having the second end of the first thermal carrier disposed therein.

21. The electronic assembly of claim 1, wherein the pad further comprises:
a second heat transfer path defined from the top surface of the first IC die, through the conductive pad, and to the conductive plate.

22. The electronic assembly of claim 2 further comprising:
at least one of solder, a brazing material, and a thermally conductive adhesive disposed between the first end of the first thermal carrier and the slot.

23. The electronic assembly of claim 2, wherein the pad further comprises:
a second heat transfer path defined from the top surface of the first IC die, through the conductive pad, and to the conductive plate.

24. The electronic assembly of claim 15, wherein the pad further comprises:
a second heat transfer path defined from the top surface of the first IC die, through the conductive pad, and to the conductive plate.

* * * * *